United States Patent [19]

Hüsler et al.

[11] Patent Number: 4,498,964

[45] Date of Patent: Feb. 12, 1985

[54] PROCESS FOR THE PHOTOPOLYMERIZATION OF UNSATURATED COMPOUNDS

[75] Inventors: Rinaldo Hüsler, Basel; Werner Rutsch; Kurt Dietliker, both of Fribourg, all of Switzerland

[73] Assignee: Ciba-Geigy Corporation, Ardsley, N.Y.

[21] Appl. No.: 502,860

[22] Filed: Jun. 9, 1983

[30] Foreign Application Priority Data

Jun. 15, 1982 [CH] Switzerland .................. 3690/82

[51] Int. Cl.³ .................................... C08F 2/50
[52] U.S. Cl. .................... 204/159.23; 204/159.24; 204/159.19; 430/923; 430/924
[58] Field of Search .............. 204/159.23, 159.24, 204/159.19

[56] References Cited

U.S. PATENT DOCUMENTS 4,318,791  3/1982  Felder et al. ................ 204/159.23
4,347,111  8/1982  Gehlhaus et al. ........... 204/159.16

OTHER PUBLICATIONS

Sasaki et al., Tetrahedron Letters 23, 1693–1696, (1982).

Primary Examiner—John C. Bleutge
Assistant Examiner—A. H. Koeckert
Attorney, Agent, or Firm—Harry Falber

[57] ABSTRACT

Compounds of the formula I, II, III, IV or V

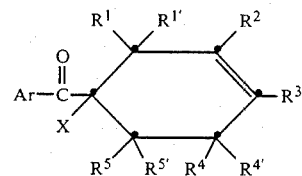

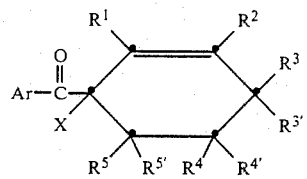

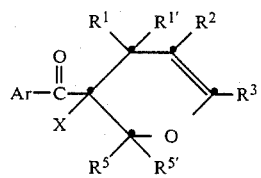

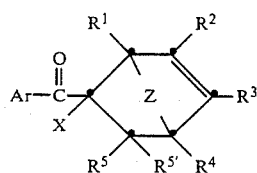

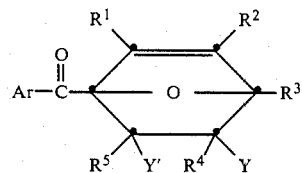

in which Ar, X, Y, Y', $R^1$ to $R^5$ and $R^{1'}$ to $R^{5'}$ are as defined in claim 1, can be used as photoinitiators for the photopolymerization of unsaturated compounds. They can be prepared by a Diels-Alder reaction and/or a Grignard reaction.

9 Claims, No Drawings

PROCESS FOR THE PHOTOPOLYMERIZATION OF UNSATURATED COMPOUNDS

The invention relates to a process for the photopolymerisation of unsaturated compounds, using specific photoinitiators belonging to the class comprising the aroyl compounds. These are aryl cycloalkenyl ketones and aryl oxacycloalkenyl ketones which carry an O-functional or N-functional group in the -position relative to the carbonyl group. Insofar as these compounds are novel, the invention also relates to these compounds. Finally, the invention also relates to compositions consisting of photopolymerisable, unsaturated compounds and these photoinitiators.

Photochemical polymerisation processes have acquired considerable importance in industry, in particular in cases where thin layers have to be cured within a short time, for example when curing paint coatings or drying printing inks. Compared with conventional curing processes, UV irradiation in the presence of photoinitiators has a number of advantages, the most important of which is, perhaps, the high rate of photo-curing. The rate depends greatly on the photoinitiator used and there has been no lack of attempts to replace the conventional initiators by increasingly better and more effective compounds. These very effective photoinitiators include aroyl compounds, such as wholly aromatic ketones (benzophenones), benzoins and benzoin ethers or benzils and benzil ketals. Aromatic-aliphatic ketones containing, in the -position, a tertiary carbon atom on which there is a hydroxyl group or amino group or a derivative of such a group, have also been found very effective. The structural principle of these compounds could be characterised by the general formula

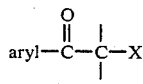

X=OH, OR, NH₂, NHR, NR₂
These include the compounds described in German Offenlegungsschriften Nos. 2,722,264 and 2,808,459 and in European Pat. No. A 3002. It is also stated in European Pat. No. A 3002 that the aliphatic moiety of the compound can be a cycloalkane radical, a typical example of this being 1-benzoylcyclohexanol which is described as compound No. 4 in that text. Compounds having an unsaturated cycloaliphatic ring have hitherto not been described as photoinitiators. Evidently there have been prejudices against the use of unsaturated compounds as photoinitiators, for example on the grounds of possible unfavourable effect on the radical chain mechanism of the polymerisation reaction. In fact, olefinically unsaturated compounds have never acquired industrial importance as photoinitiators.

It has now been found, surprisingly, that cycloaliphatic or hetero-cycloaliphatic aroyl compounds which are unsaturated in the ring, in particular aryl cycloalkenyl ketones and aryl oxacycloalkenyl ketones, have a usefulness as photoinitiators which is not inferior to the saturated compounds known from European Pat. No. A 3002, and have certain advantages in individual cases. It is not yet known with certainty whether these unsaturated ketones become incorporated into the polymer chain through copolymerisation, possibly such an incorporation is advantageous.

The invention relates to a process for the photopolymerisation of unsaturated compounds in the presence of a photoinitiator belonging to the series of the aroyl compounds, which comprises using, as the photoinitiator, one or more compounds of the formula I, II, III, IV or V

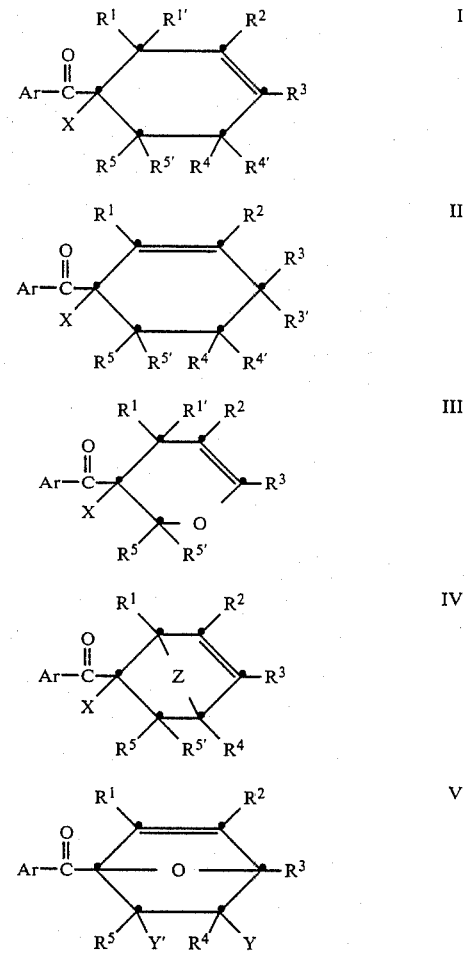

wherein Ar is C₆–C₁₂-aryl, thienyl, pyridyl or furyl which is unsubstituted or substituted by one or more of the radicals halogen, phenyl, C₁–C₁₂-alkyl, C₅–C₈-cycloalkyl, —OH, C₁–C₄-alkoxy, phenoxy, —SH, C₁–C₄-alkylthio, phenylthio, 2-hydroxyethylthio, C₂–C₅-alkanoylamino, benzoylamino, C₂–C₁₂-dialkylamino, pyrrolidino, piperidino, morpholino, 4-methylpiperazino or benzoyl, R¹, R¹', R², R³, R³', R⁴, R⁴', R⁵ and R⁵' independently of one another are H, C₁–C₈-alkyl, phenyl or C₃–C₈-alkenyl, X is a radical —N(R⁶)(R⁷), —OR⁸ or —OSi(R⁹)₂(R¹⁰) in which R⁶ and R⁷ independently of one another are H, C₁–C₁₂-alkyl or C₂–C₄-alkyl, C₃–C₅-alkenyl, cycloalkyl, C₇–C₉-phenylalkyl or phenyl which is substituted by OH, C₁–C₁₂-alkoxy, C₂–C₅-carboalkoxy or CN, or R⁶ and R⁷ together are C₃–C₅-alkylene which can be interrupted by —O— or —N(CH₃)—, R⁸ is hydrogen, C₁–C₁₂-alkyl, C₃–C₁₂-alkoxyalkyl, C₃–C₅-alkenyl, benzyl, phenyl or 2-tetrahydropyranyl and R⁹ and R¹⁰ are C₁–C₄-alkyl or phenyl, Y is hydrogen, —CN, —COOH, —COOR¹¹, —CO—R¹² or —CO-phenyl, R¹¹ being $C_1$–$C_{12}$-alkyl, $C_2$–$C_4$-hydroxyalkyl, $C_3$–$C_8$-alkoxyalkyl or cyclohexyl and $R^{12}$ being hydrogen or $C_1$–$C_4$-alkyl, Y' is hydrogen, —COOH or —COOR$^{11}$, or Y and Y' together are —CO—O—CO— and Z is a group of the formula —CH$_2$—, —CH$_2$CH$_2$—, —C(CH$_3$)$_2$—,

or —O—.

As unsubstituted aryl, Ar can be phenyl, naphthyl or biphenylyl. As a substituted aryl radical, Ar is preferably a substituted phenyl radical. The following are examples of Ar as a substituted aryl radical: 4-chlorophenyl, 3-bromophenyl, 4-bromo-1-naphthyl, 2,4-dichlorophenyl, p-tolyl, o-tolyl, 2,4-xylyl, 4-tert.-butylphenyl, 4-isopropylphenyl, 4-nonylphenyl, 4-cyclohexylphenyl, 2,4,6-trimethylphenyl, 2-ethoxyphenyl, 4-methoxyphenyl, 4-butoxyphenyl, 4-phenoxyphenyl, 3-methylthiophenyl, 4-(2-hydroxyethylthio)-phenyl, 4-phenylthiophenyl, 4-acetylaminophenyl, 3-benzoylaminophenyl, 3-dimethylaminophenyl, 4-diethylaminophenyl, 4-morpholinophenyl, 4-(4-methylpiperazino)-phenyl, 3-benzoylphenyl or 4-benzoylphenyl.

As alkyl, $R^1$, $R^{1'}$, $R^2$, $R^3$, $R^{3'}$, $R^4$, $R^{4'}$, $R^5$ and $R^{5'}$ can be, for example, methyl, ethyl, isopropyl, butyl, hexyl or octyl. As alkenyl, the same substituents can be, for example, allyl, methallyl or 2-buten-1-yl. $R^1$ to $R^5$ are preferably hydrogen or methyl and $R^{1'}$ to $R^{5'}$ are preferably hydrogen.

As an amino radical —N(R$^6$)(R$^7$), X can be a primary, secondary or tertiary amino group, for example methylamino, butylamino, dodecylamino, dimethylamino, diethylamino, diisopropylamino, dibutylamino, dihexylamino, didecylamino, 2-hydroxyethylamino, di-(2-hydroxyethyl)-amino, di-(2-methoxyethyl)-amino, 3-ethoxypropylamino, 2-butoxypropylamino, 3-dodecyloxypropylamino, 2-cyanoethylamino, di-(2-cyanoethyl)-amino, allylamino, diallylamino, methylallylamino, cyclohexylbutylamino, benzylamino, 2-phenylethylamino, dibenzylamino, benzyldodecylamino, benzylcyclohexylamino, phenylmethylamino, phenylbenzylamino, pyrrolidino, piperidino, morpholino or 4-methylpiperazino.

As a radical —OR$^8$, X can be hydroxyl or an ether group, for example methoxy, ethoxy, butoxy, 2-ethylbutoxy, isodecyloxy, n-dodecyloxy, 2-butoxyethoxy, allyloxy, methallyloxy, benzyloxy, phenoxy or tetrahydropyranyl-2-oxy.

As a radical —OSi(R$^9$)$_2$(R$^{10}$), X can be, for example, trimethylsiloxy, tripropylsiloxy, triphenylsiloxy, dimethylphenylsiloxy, methyldiphenylsiloxy or dimethyltert.-butylsiloxy.

If Y or Y' is a —COOR$^{11}$ group, R$^{11}$ can be alkyl, for example methyl, ethyl, isopropyl, tert.-butyl, n-butyl, n-hexyl, 2-ethylbutyl, n-octyl, iso-octyl or n-dodecyl.

R$^{11}$ can also be hydroxyalkyl or alkoxyalkyl, for example 2-hydroxyethyl, 2-hydroxypropyl, 3-hydroxybutyl, 2-methoxyethyl, 2-butoxyethyl, 2-ethoxypropyl or 2-hexyloxyethyl.

It is preferable to use photoinitiators of the formulae I, II, III, IV or V in which Ar is $C_6$–$C_{10}$-aryl which is unsubstituted or substituted by chlorine, $C_1$–$C_4$-alkyl, $C_1$–$C_4$-alkoxy, $C_1$–$C_4$-alkylthio, 2-hydroxyethylthio, phenoxy, phenylthio or benzoyl, R$^1$, R$^2$, R$^3$, R$^4$ and R$^5$ independently of one another are H, phenyl or methyl and R$^{1'}$, R$^{3'}$, R$^{4'}$ and R$^{5'}$ are hydrogen, X is a radical —N(R$^6$)(R$^7$), —OR$^8$ or —OSi(R$^9$)$_3$ in which R$^6$ and R$^7$ independently of one another are H, $C_1$–$C_4$-alkyl or $C_3$–$C_5$-alkenyl, or the two radicals together are $C_3$–$C_5$-alkylene which can be interrupted by —O— or —N(CH$_3$)—, R$^8$ is hydrogen, $C_1$–$C_{12}$-alkyl, $C_3$–$C_5$-alkenyl, benzyl or 2-tetrahydropyranyl and R$^9$ is methyl or phenyl, Y is a radical —CN or —COOR$^{11}$ and Y' is hydrogen or —COOR$^{11}$, R$^{11}$ being $C_1$–$C_4$-alkyl, and Z is a group of the formula —CH$_2$—, —CH$_2$CH$_2$—, —C(CH$_3$)$_2$— or —O—.

It is particularly preferable to use photoinitiators of the formula I, II or IV in which Ar is phenyl or phenyl which is substituted by Cl, CH$_3$, —OCH$_3$, —SCH$_3$, phenoxy or benzoyl, R$^1$, R$^2$, R$^3$, R$^4$ and R$^5$ independently of one another are hydrogen or methyl and R$^{1'}$, R$^{3'}$, R$^{4'}$ and R$^{5'}$ are hydrogen, X is a radical —N(R$^6$)(R$^7$), —OR$^8$ or —OSi(R$^9$)$_3$ in which R$^6$ and R$^7$ are $C_1$–$C_4$-alkyl or R$^6$ and R$^7$ together are $C_3$–$C_5$-alkylene which can be interrupted by —O— or —N(CH$_3$)—, R$^8$ is hydrogen, methyl, allyl or benzyl and R$^9$ is methyl, and Z is a group of the formula —CH$_2$—, —CH$_2$CH$_2$— or —O—.

The following are examples of compounds of the formula I which can be used in accordance with the invention: 1-benzoyl-1-diethylaminocyclohex-3-ene, 1-benzoyl-1-hydroxy-6-methylcyclohex-3-ene, 1-benzoyl-1-dimethylaminocyclohex-3-ene, 1-benzoyl-1-hydroxy-4-methylcyclohex-3-ene, 1-benzoyl-1-hydroxy-3-methylcyclohex-3-ene, 1-benzoyl-3,4-dimethyl-1-hydroxycyclohex-3-ene, 1-benzoyl-1-hydroxycyclohex-3-ene, 1-(3,4-dimethylbenzoyl)-1-hydroxy-2-phenylcyclohex-3-ene, 1-(p-toluyl)-1-morpholino-4-methylcyclohex-3-ene, 1-(4-phenylthiobenzoyl)-1-cyclohexylaminocyclohex-3-ene, 1-β-naphthoyl-1-hydroxy-4-methylcyclohex-3-ene, 1-furoyl-1-trimethylsiloxy-4-methylcyclohex-3-ene, 1-(4-propionylamidobenzoyl)-1-phenoxy-4-methylcyclohex-3-ene, 1-(4-dimethylaminobenzoyl)-1-(dimethyl-tert.-butylsiloxy)-3,4-dimethylcyclohex-3-ene, 1-(4-morpholinobenzoyl)-1-benzyloxy-2,5-dimethylcyclohex-3-ene, 1-(4-benzoylbenzoyl)-1-hydroxy-2,5-diphenylcyclohex-3-ene, 1-(4-cyclopentylbenzoyl)-1-(diallylamino)-4-methyl-6-ethylcyclohex-3-ene, 1-(2,3-dichlorobenzoyl)-1-hydroxy-4-butylcyclohex-3-ene, 1-[3,4-bis(methylthio)benzoyl]-1-anilinocyclohex-3-ene, 1-(3,4-dibutylbenzoyl)-1-(4-methylpiperazino)-3,4-dimethyl-6-ethylcyclohex-3-ene, 1-(4-butoxybenzoyl)-1-dibenzylaminocyclohex-3-ene, 1-(3-diethylaminobenzoyl)-1-(4-methylpiperazino)-2,6-dimethylcyclohex-3-ene, 1-(4-cyclohexylbenzoyl)-1-allyloxy-5-propylcyclohex-3-ene, 1-(3-chloro-4-propylbenzoyl)-1-morpholino-2,5-diphenyl-6,6-dimethylcyclohex-3-ene, 1-[4-(2-hydroxyethylthio)-benzoyl]-6-ethyl-1-hydroxy-3,4,6-trimethylcyclohex-3-ene, 1-benzoyl-6-methyl-1-trimethylsiloxycyclohex-3-ene, 1-(4-isopropylbenzoyl)-1-hydroxy-2,3,4,5,6-pentamethylcyclohex-3-ene, 2,6-dimethyl-1-morpholino-3-phenyl-1-(3-phenoxybenzoyl)-cyclohex-3-ene, 6-ethyl-1-(3,4-dimethoxybenzoyl)-1-morpholino-3,5,5-trimethylcyclohex-3-ene, 1-[3-(2-hydroxyethylthio)-4-methoxybenzoyl]-morpholino-3,4,6-trimethylcyclohex-3-ene, 6-methyl-1-(4-methylthiobenzoyl)-1-morpholinocyclohex-3-ene, 6-methyl-1-(4-methoxybenzoyl)-1-morpholinocyclohex-3-ene, 6-ethyl-3,4-dimethyl-1-[4-(2-hydroxyethylthio)-benzoyl]-1-morpholinocyclohex-3-ene, 2,6-dimethyl-1-(4-isopropylthiobenzoyl)-1-di(2-methoxyethyl)aminocyclohex-3-ene, 6,6-dimethyl-1-(4-methoxybenzoyl)-1- morpholinocyclohex-3-ene, 1-(4-hydroxybenzoyl)-4-methyl-1-[N-methyl-N-(2-methoxyethyl)-amino]-6-phenylcyclohex-3-ene, 1-(4-ethoxybenzoyl)-6-ethyl-3-phenyl-1-piperidinocyclohex-3-ene and 5,6-dimethyl-1-(4-mercaptobenzoyl)-1-morpholinocyclohex-3-ene.

The following are examples of compounds of the formula II: 1-benzoylhydroxycyclohex-2-ene, 1-hydroxy-3-methyl-1-(4-toluyl)-cyclohex-2-ene, 1-(4-chlorobenzoyl)-3,5,5-trimethyl-1-trimethylsiloxycyclohex-2-ene, 1-hydroxy-1-(3-pyridylcarbonyl)-cyclohex-2-ene, 3-methyl-1-(2-tetrahydropyranyl)-oxy-1-thenoylcyclohex-2-ene, 1-(4-dodecylbenzoyl)-3-methyl-1-(phenyldimethylsiloxy)-cyclohex-2-ene, 1-(4-tert.-butylthiobenzoyl)-1-hydroxy-3,5,5-trimethylcyclohex-2-ene, 1-(2,4-dichlorobenzoyl)-1-dimethylamino-6-isopropylcyclohex-2-ene, 1-(4-methoxybenzoyl)-1-morpholinocyclohex-2-ene and 4-tert.-butyl-1-(4-methylthiobenzoyl)-1-morphilinocyclohex-2-ene.

The following are examples of compounds of the formula III: 2-methyl-3-(4-methylthiobenzoyl)-3-morpholino-3,4-dihydro-2H-pyran, 2-ethyl-3-(2,6-dichlorobenzoyl)-3-trimethylsiloxy-3,4-dihydro-2H-pyran, 2,6-dimethyl-3-(4-methoxybenzoyl)-3-morpholino-3,4-dihydro-2H-pyran and 3-hydroxy-3-(4-toluyl)-3,4-dihydro-2H-pyran.

The following are examples of compounds of the formula IV: 2-benzoyl-2-morpholinobicyclo[2.2.1]hept-5-ene, 2-benzoyl-2-hydroxybicyclo[2.2.1]hept-5-ene, 2-(4-phenoxybenzoyl)-2-butoxy-7,7-dimethylbicyclo[2.2.1]hept-5-ene, 1-methyl-2-(3,4-dichlorobenzoyl)-2-hydroxybicyclo[2.2.1]hept-5-ene, 2-(4-bromobenzoyl)-2-pyrrolidino-3-methylbicyclo[2.2.1]hept-5-ene, 2-(4-benzoylbenzoyl)-2-benzyloxy-7,7-dimethylbicyclo[2.2.1]hept-5-ene, 2-[4-(2-hydroxyethylthio)-benzoyl]-2-dimethylamino-4,7,7-trimethylbicyclo[2.2.1]hept-5-ene, 2-(4-chlorobenzoyl)-2-piperidinobicyclo[2.2.2]oct-5-ene, 2-(4-benzamido-3-chlorobenzoyl)-2-hydroxy[2.2.2]oct-5-ene, 2-(3,4-diethylbenzoyl)-2-(2-tetrahydropyranyloxy)-3-methylbicyclo[2.2.2]oct-5-ene, 2-benzoyl-2-triphenylsiloxy-7-oxabicyclo[2.2.1]hept-5-ene, 2[4-(4-methylpiperazino)-benzoyl]-2-hydroxy-7-oxabicyclo[2.2.1]hept-5-ene, 2-(4-ethylthio-3-methylbenzoyl)-2-dimethylamino-3-methyl-7-oxabicyclo[2.2.1]hept-5-ene, 2-(3-isopropylbenzoyl)-2-hydroxy-3-phenyl-7-oxabicyclo[2.2.1]hept-5-ene, 2-(4-methylthiobenzoyl)-3-methyl-2-morpholinobicyclo[2.2.1]hept-5-ene, 2-(4-methoxybenzoyl)-3-methyl-2-morpholinobicyclo[2.2.1]hept-5-ene, 3-ethyl-2-[4-(2hydroxyethylthio)-benzoyl]-2-(4-methylpiperazino)-bicyclo[2.2.1]hept-5-ene, exo-2-benzoyl-2-hydroxybicyclo[2.2.2]oct-5-ene, endo-2-benzoyl-2-hydroxybicyclo[2.2.2]oct-5-ene, 2-(4-methoxybenzoyl)-2-morpholino-3-methylbicyclo[2.2.2]oct-5-ene, 3-ethyl-2-(4-methylthiobenzoyl)-2-morpholinobicyclo[2.2.2]oct-5-ene, 2-[4-(2-hydroxyethylthio)-benzoyl]-3-phenyl-2-piperidinobicyclo[2.2.2]oct-5-ene, 2-(4-methoxybenzoyl)-3-methyl-2-morpholino-7-oxabicyclo[2.2.1]hept-5-ene, 3,3-dimethyl-2-(4-methylthiobenzoyl)-2-morpholino-7-oxabicyclo[2.2.1]hept-5-ene and 2-(4-chlorobenzoyl)-2-hydroxy-3-methyl-1,4,5,6-tetraphenyl-7-oxabicyclo[2.2.1]hept-5-ene.

The following are examples of compounds of the formula V: 1-benzoyl-5-ethoxycarbonyl-7-oxabicyclo[2.2.1]hept-2-ene, 1-(3,4-dimethylbenzoyl)-5-(2-ethylhexyloxycarbonyl)-7-oxabicyclo[2.2.1]hept-2-ene, 1-(4-ethoxybenzoyl)-5-methoxycarbonyl-6-methyl-7-oxabicyclo[2.2.1]hept-2-ene, 1-[4-(2-hydroxyethylthio)-benzoyl]-5-cyano-7-oxabicyclo[2.2.1]hept-2-ene, 1-α-naphthoyl-5-carboxy-7-oxabicyclo[2.2.1]hept-2-ene, 1-(3,4-dichlorobenzoyl)-4-methyl-5-benzoyl-7-oxabicyclo[2.2.1]hept-2-ene, 1-(4-benzoylbenzoyl)-5-formyl-7-oxabicyclo[2.2.1]hept-2-ene, 1-(4-dodecylbenzoyl)-5-methyl-5-formyl-7-oxabicyclo[2.2.1]hept-2-ene, 1-benzoyl-5,6-bis-(ethoxycarbonyl)-7-oxabicyclo[2.2.1]hept-2-ene, 1-(4-phenylbenzoyl)-5-methoxycarbonyl-6-carboxy-7-oxabicyclo[2.2.1]hept-2-ene, 1-(4-phenylbenzoyl)-5-carbonyl-6-methoxycarbonyl-7-oxabicyclo[2.2.1]hept-2-ene, 1-benzoyl-6-ethoxycarbonyl-2,3-dimethyl-7-oxabicyclo[2.2.1]hept-2-ene and 1-benzoyl-7-oxabicyclo[2.2.1]hept-2-ene-5,6-dicarboxylic acid 5,6-anhydride.

Amongst the compounds which can be used in accordance with the invention, the compound of the formula I in which Ar is phenyl, X is hydroxyl, $R^3$ is methyl and $R^1$, $R^{1'}$, $R^2$, $R^4$, $R^{4'}$, $R^5$ and $R^{5'}$ are hydrogen, is a known compound. It can be prepared, according to T. Sasaki, Y. Ishibashi and M. Ohno/Tetrahedron Letters 23, 1,693 (1982), by a Diels-Alder reaction in the following way:

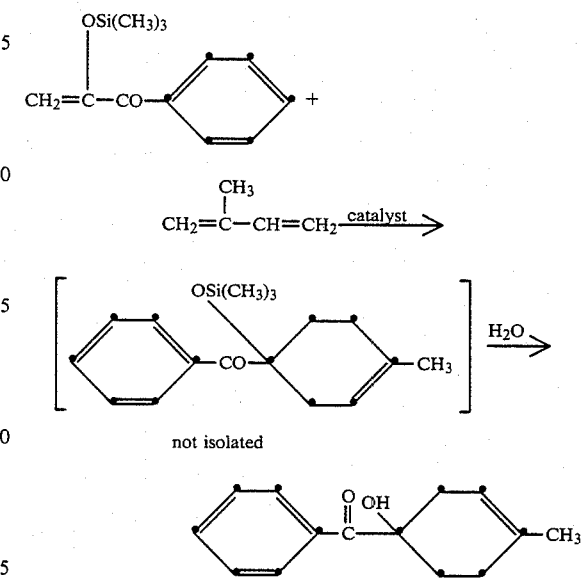

$SnCl_4$ and $BF_4.(C_2H_5)_3O$ were used as the catalyst for the cyclo-addition. The primary cyclisation product was hydrolysed with methanolic hydrochloric acid without being isolated.

All the other compounds of the formulae I, II, III, IV and V which can be used in accordance with the invention are novel compounds and, as such, also form the subject of the invention.

They can be prepared by various methods.

A method which is generally applicable for the preparation of compounds of the formulae I, III, and IV is the Diels-Alder reaction. In this reaction, an α-substituted aryl vinyl ketone VI is reacted, as a dienophil, with a diene VII. If the diene used is an open-chain diene, compounds of the formula I are then formed:

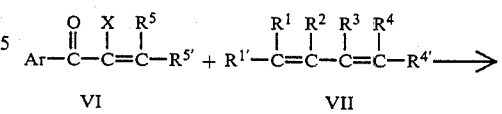

-continued

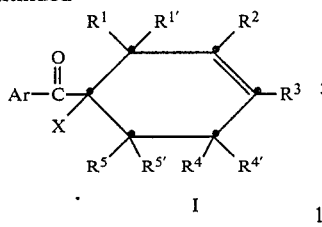

I

The synthesis of 1-benzoyl-1-hydroxy-4-methylcyclohex-3-ene by the method of Sasaki et al., described just now, is a special case of this general method of preparation. Examples of dienes of the formula VII are the dienes which are generally suitable for Diels-Alder reactions, for example butadiene, isoprene, 2,3-dimethylbutadiene or 1,4-diphenylbutadiene.

If the diene used is an $\alpha,\beta$-unsaturated carbonyl compound (VIII), a product of the formula III is obtained:

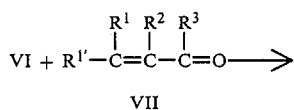

VII

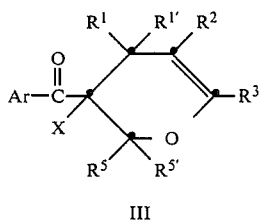

III

Examples of VIII are, in particular, acrolein, methacrolein and methyl vinyl ketone.

If the diene used is a cyclic diene (IX), a product of the formula IV is obtained:

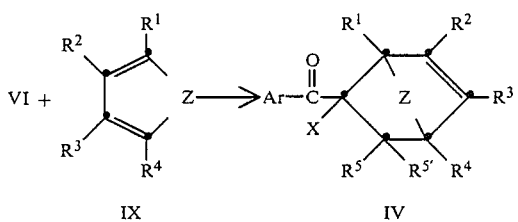

IX                IV

Examples of cyclic dienes IX are, in particular, cyclopentadiene, cyclohexadiene and furan.

In all these cases of the Diels-Alder reaction, the group X can be obtained in the cyclic adduct or the group X is converted into a group X different therefrom in a subsequent reaction stage. An example of this is the synthesis of 1-benzoyl-1-hydroxy-4-methylcyclohex-3-ene by the method of Sasaki et al., mentioned just now, in which the group —OSi(CH$_3$)$_3$ is first introduced as X and is converted into an OH group by subsequent hydrolysis.

The Diels-Alder reaction can be catalysed by Lewis acids. Examples of these are AlCl$_3$, C$_2$H$_5$AlCl$_2$, (C$_2$H$_5$)$_2$AlCl, SnCl$_4$, BF$_3$ and BF$_3$ adducts.

A variant of these Diels-Alder reactions can be used for the preparation of compounds of the formula V. For this variant, 2-aroylfurans (X) are used as the diene and $\alpha,\beta$-unsaturated carboxylic acids or derivatives thereof (XI) are used as the dienophil:

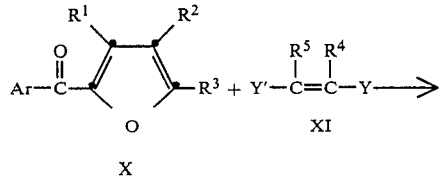

X

V

Examples of suitable dienophils of the formula XI are acrylic acid and methacrylic acid and esters and nitriles thereof, maleic acid and the anhydride, esters and half-esters thereof and vinyl ketones. If the dienophil used is maleic anhydride, the adduct can be modified appropriately by hydrolysis or esterification.

A method which is generally applicable for the preparation of compounds of the formulae I, II, III and IV is the reaction of the corresponding 1-cyano compounds with aromatic Grignard compounds. The 1-cyano compounds are cyanohydrins or $\alpha$-aminonitriles and are accordingly obtainable from the corresponding 1-oxo compounds. This may be illustrated diagrammatically using as an example the synthesis of II:

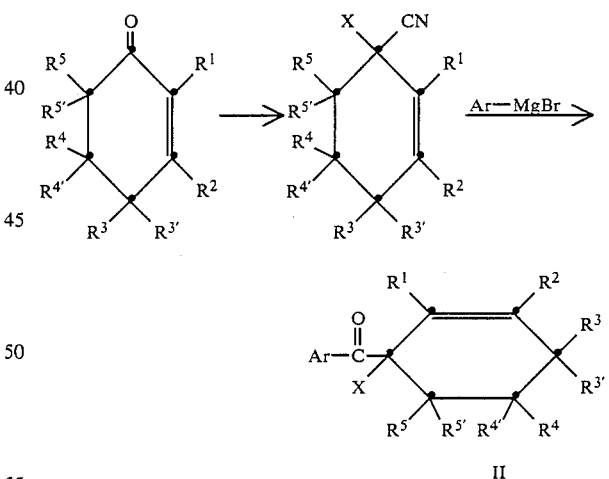

II

Instead of the free cyanohydrins (X=OH) it is possible to use advantageously, for the Grignard synthesis, derivatives in which the OH group is blocked by protective groups which can be detached by hydrolysis after the Grignard reaction. Examples of these are the trimethylsilyl derivatives or the tetrahydropyran adducts. Such blocked cyanohydrins can also be prepared from the oxo compounds in one stage, for example by reaction with trimethylsilyl cyanide by the method of S. König et al., Chem. Ber. 113, 3,783 (1980).

More precise details of the methods of preparation can be seen in the examples which follow later.

The compounds of the formulae I, II, III, IV and V are suitable for use as photoinitiators for the photopolymerisation of unsaturated compounds. These are monounsaturated or polyunsaturated olefinic compounds and mixtures thereof. The unsaturated compounds can be low-molecular (monomeric) or higher-molecular (oligomeric).

Examples of monomers containing a double bond are alkyl acrylates or methacrylates or hydroxyalkyl acrylates or methacrylates, for example methyl, ethyl, butyl, 2-ethylhexyl or 2-hydroxyethyl acrylate, isobornyl acrylate, methyl methacrylate or ethyl methacrylate. Further examples are acrylonitrile, acrylamide, methacrylamide, N-substituted (meth)acrylamides, vinyl esters, such as vinyl acetate, vinyl ethers, such as isobutyl vinyl ether, styrene, alkylstyrenes, halogenostyrenes, N-vinylpyrrolidone, vinyl chloride or vinylidene chloride.

Examples of monomers containing several double bonds are ethylene glycol diacrylate, propylene glycol diacrylate, neopentylglycol diacrylate, hexamethylene glycol diacrylate or bisphenol A diacrylate, 4,4'-bis-(2-acryloyloxyethoxy)-diphenylpropane, trimethylolpropane triacrylate, pentaerythritol triacrylate or tetraacrylate, vinyl acrylate, divinylbenzene, divinyl succinate, diallyl phthalate, triallyl phosphate, triallyl isocyanate or tris-(2-acryloyloxyethyl) isocyanurate.

Examples of higher-molecular (oligomeric) polyunsaturated compounds are acrylated epoxide resins, acrylated polyethers, acrylated polyurethanes or acrylated polyesters. Further examples of unsaturated oligomers are unsaturated polyester resins which are prepared, in most cases, from maleic acid or phthalic acid and one or more diols and which have molecular weights of about 500 to 3,000. Unsaturated oligomers of this type can also be described as prepolymers.

Photopolymerisable mixtures can be, for example, mixtures of a monounsaturated monomer and a polyunsaturated monomer. Mixtures of a polyunsaturated monomer and an unsaturated oligomer (prepolymer) are used more frequently, however. Three-component mixtures of this type are also used frequently. In these mixtures the prepolymer is primarily the decisive factor for the properties of the polymer; by varying it, the properties of the cured film can be affected by those skilled in the art. The polyunsaturated monomer functions as a crosslinking agent which makes the polymer insoluble. The monounsaturated monomer functions as a reactive diluent by means of which the viscosity is reduced without the necessity of using a solvent.

Two-component and three-component systems of this type based on a prepolymer are used for printing inks as well as for paints, photoresists and other coloured photocurable compositions. The binders used for printing inks are also frequently one-component systems based on photocurable prepolymers.

Unsaturated polyester resins are mostly used in two-component systems together with a monounsaturated monomer, preferably styrene. Specific one-component systems, for example polymaleimides or polyalkones, are often used for photoresists.

In addition, the photopolymerisable mixture can contain minor proportions of non-photopolymerisable, film-forming components. These can be, for example, polymers which dry physically or solutions thereof in organic solvents, for example nitrocellulose or cellulose acetobutyrate. They can, however, also be resins which can be cured chemically or by means of heat, for example polyisocyanates, polyepoxides or melamine resins.

The concomitant use of resins which can be cured by heat is important for use in so-called hybrid systems, which are photopolymerised in a first stage and are crosslinked by subsequent heat treatment in a second stage.

Depending on their end use, the photopolymerisable mixtures can contain a number of other additives. Examples of these are thermal inhibitors, which are intended to prevent polymerisation prior to irradiation and thus to increase the stability on storage. Examples of these are hydroquinone and hydroquinone derivatives, naphthols, copper compounds, organic phosphorus compounds, quaternary ammonium compounds or hydroxylamine derivatives.

Other known additives are curing accelerators, for example tertiary amines, aminocarboxylic acid esters and aminoketones. Examples of these are triethanolamine, N-methyldiethanolamine, p-dimethylaminobenzoic acid alkyl esters or Michler's ketone. Combination with another photoinitiator of the aryl ketone type, for example benzophenone derivatives, anthraquinone derivatives, thioxanthone derivatives, benzil ketals, α-hydroxyacetophenone derivatives or benzoin derivatives, can also exert an accelerating effect on the photopolymerisation.

Paraffin or similar wax-like substances are frequently added to photocurable mixtures in order to eliminate the inhibiting action of the oxygen of the atmosphere. These substances float to the top at the start of the polymerisation, owing to inadequate solubility in the polymer, and form a transparent surface layer which prevents the access of air. The oxygen of the atmosphere can also be deactivated by introducing autoxidisable groups, for example allyl groups, into the resin to be cured.

Further additives which are frequently used are fillers, such as silica, talc or gypsum, pigments, dyestuffs, fibres, thixotropic agents or flow control auxiliaries.

The most important fields of use of photopolymerisation are those relating to paints and printing inks, the preparation of photoresists and the preparation of printing plates. The photoinitiators according to the invention are added to the photopolymerisable compounds in an amount of 0.1 to 20% by weight, in particular 0.5 to 5% by weight.

The photoinitiators are generally added to the photopolymerisable mixtures merely by stirring, since most of these mixtures are liquid or readily soluble. In most cases, solution of the initiators according to the invention results, which ensures that they are uniformly distributed and also that the polymers are transparent.

In specific cases, it can be advantageous to add two or more compounds of the formula I, II, III, IV or V to the photopolymerisable mixture.

Polymerisation is effected by the known methods of photopolymerisation by irradiation with light rich in shortwave radiation. Examples of light sources are medium-pressure, high-pressure and low-pressure mercury vapour lamps, and also superactinic fluorescent tubes having emission maxima within the range between 250 and 400 nm.

By adding photosensitisers it is possible to shift the spectral sensitivity into specific ranges, so that it is also possible to work with relatively long-wave lamps. Examples of such photosensitisers are organic dyestuffs or multinuclear, condensed aromatic compounds, for example perylene, anthracene derivatives or thioxanthone derivatives.

The examples which follow illustrate the preparation of the compounds according to the invention and their use as photoinitiators. In these examples, parts denote parts by weight, while the temperatures are quoted in °C.

EXAMPLE 1

Preparation of 1-benzoyl-1-hydroxycyclohex-3-ene by the Diels-Alder synthesis (a) Following the method of W. H. Hartung and F. Crossley (Organic Synthesis Coll. Vol. II, 363), 315 g (2.35 mols) of propiophenone are reacted with methyl nitrite, produced in situ from 186 g of $NaNO_2$ and 121.5 ml of methanol in the presence of 150 ml of concentrated $H_2SO_4$). 165 g of 1-phenylpropane-1,2-dione-2-oxime of melting point 115° are obtained after working up the product and recrystallising it from toluene.

(b) 100 g of this oxime are converted into 1-phenylpropane-1,2-dione by the method of W. W. Hartman and L. J. Roll (Organis Synthesis Coll. Vol. III, 20) by steam distillation from 20% sulfuric acid. Yield 87.4 g of a yellow oil.

(c) 0.46 g (3.4 mmols) of anhydrous zinc chloride are added to 14.8 g (146 mmols) of dry triethylamine in a previously dried glass apparatus, under an atmosphere of nitrogen. After stirring for 3 hours at room temperature, a milky suspension of the zinc chloride is formed, to which 19.85 g (134 mmols) of 1-phenylpropane-1,2-dione in 50 ml of methylene chloride are added. The resulting homogeneous solution is cooled in an icebath and 15.89 g (146 mmols) of trimethylchlorosilane are added slowly. The icebath is then removed and the mixture is stirred at room temperature for 16 hours. It is then diluted with 200 ml of dry diethyl ether and stirred for 15 minutes, and the precipitated salts are filtered off via Hyflo under nitrogen. Concentrating the solution and drying the residue in a high vacuum gives 29.30 g (99%) of a brown-red oil which contains >97% of 1-phenyl-2-trimethylsilyloxyprop-2-en-1-one, according to $^1$H-NMR. This oil is employed without further purification for the following reactions.

(d) 7 g (31.7 mmols) of 1-phenyl-2-trimethylsilyloxyprop-2-en-1-one are dissolved in 100 ml of dry methylene chloride in a previously dried apparatus, under an atmosphere of argon, and the solution is cooled to 0° C. in an icebath. 14 ml (~160 mmols) of butadiene are then condensed into the solution, and 4 ml (31.7 mmols) of boron trifluoride-etherate are added slowly. The mixture is then stirred under an atmosphere of argon for about 2 hours at 0° C. and for 14 hours at room temperature. The solvent and the excess butadiene are distilled off on a rotary evaporator, the residue is taken up in 250 ml of methanol and 25 ml of 1N hydrochloric acid, and the mixture is stirred for 30 minutes at room temperature. It is then poured into 100 ml of ice-cold saturated sodium bicarbonate solution, the methanol is removed on a rotary evaporator and the water phase remaining is extracted with diethyl ether. The extracts are dried over $MgSO_4$ and concentrated, and the residual viscous brown oil is purified by chromatography over silica gel (mobile phase: 9:1 hexane/ethyl acetate). This gives 3.50 g (55%) of 1-benzoyl-1-hydroxycyclohex-3-ene, which is purified by bulb tube distillation (140°–145°/6×10$^{-2}$ mm Hg). It is a colourless oil.

Analysis $C_{13}H_{14}P_2$ (202.23): Calculated: C 77.20%; H 6.98%; O 15.82%. Found: C 77.11%; H 6.89%; O 15.92%.

If the 1-phenyl-2-trimethylsiloxyprop-2-en-1-one is reacted with isoprene instead of butadiene, an analogous procedure gives an oily product which, after bulb tube distillation (150°/0.06 mm Hg), gave the following analysis:

$C_{14}H_{16}O_2$ (216.28): Calculated: C 77.75%; H 7.46%; O 14.80%. Found: C 77.88%; H 7.62%; O 14.81%.

According to $^1$H-NMR analysis (at 250 Mhz), this is a mixture of about 75% of 1-benzoyl-1-hydroxy-4-methylcyclohex-3-ene and approx. 25% of 1-benzoyl-1-hydroxy-3-methylcyclohex-3-ene.

An analogous Diels-Alder reaction with 2,3-dimethylbutadiene gives 1-benzoyl-1-hydroxy-3,4-dimethylcyclohex-3-ene, which, after bulb tube distillation (140°–150°/0.07 mm Hg) is a colourless oil.

Analysis $C_{15}H_{18}O_2$ (230.31): Calculated: C 78.23%; H 7.88%; O 13.90%. Found: C 78.26%; H 7.98%; O 13.85%.

EXAMPLE 2

Preparation of exo/endo-2-benzoyl-2-hydroxybicyclo[2.2.2]oct-5-ene by the Diels-Alder reaction 8 g (36 mmols) of 1-phenyl-2-trimethylsilyloxyprop-2-en-1-one are dissolved in 40 ml of dry methylene chloride in a previously dried apparatus, under an atmosphere of argon, and 10 ml (100 mmols) of freshly distilled 1,3-cyclohexadiene are added. The solution is cooled to 0° C. in an icebath, and 4.6 ml (36 mmols) of boron trifluoride-etherate are then added. The reaction mixture is then stirred, first at 0° C. and then for 4 hours at room temperature. The solvent is distilled off, together with excess cyclohexadiene, in a rotary evaporator, the residue which remains is taken up in 250 ml of methanol and 25 ml of 1N hydrochloric acid, and the mixture is stirred for 30 minutes at room temperature. It is then poured into 100 ml of ice-cold bicarbonate solution, which is stirred for 15 minutes and concentrated on a rotary evaporator. The residual water phase is extracted with diethyl ether, the extracts are dried over $MgSO_4$, and the solvent is distilled off. The residual oil is purified by flash chromatography over silica gel (mobile phase: 9:1 hexane/ethyl acetate). The main fraction is purified by bulb tube distillation (150° C./0.07 mm Hg), whereby 5.37 g (65%) of a colourless oil are obtained which, according to $^1$H-NMR analysis, consists of approx. 52% of endo- and 24% of exo-2-benzoyl-2-hydroxybicyclo[2.2.2]oct-5-ene*) and 24% of 2-hydroxy-2-phenylbicyclo[3.2.2]non-6-en-3-one. The constituents can be separated by repeated flash chromatography over silica gel (mobile phase: 9:1 pentane/ethyl acetate): endo-2-benzoyl-2-hydroxybicyclo[2.2.2]oct-5-ene, melting point 69° C. (recrystallised from diethyl ether/pentane)

*The prefix exo- or endo- relates to the stearic position of the benzoyl radical.

Analysis $C_{15}H_{16}O_2$ (228.27): Calculated: C 78.92%; H 7.07%; O 14.02%. Found: C 78.75%; H 7.00%; O 14.02%.

exo-2-benzoyl-2-hydroxybicyclo[2.2.2]oct-5-ene, melting point 47°–50° C.

Analysis $C_{15}H_{16}O_2$ (228.27%): Calculated: C 78.92%; H 7.07%; O 14.02%. Found: C 78.93%; H 7.01%; O 13.89%.

EXAMPLE 3

Preparation of 1-benzoyl-1-hydroxycyclohex-2-ene by Grignard synthesis (a)

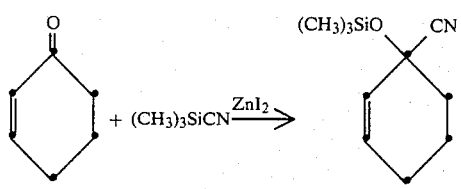

0.1 mol of 2-cyclohexene-1-one are added dropwise to 0.11 mol of trimethylsilyl cyanide and a pinch of anhydrous zinc iodide, at room temperature and under an inert gas ($N_2$). In the course of this, the temperature rises to 60° to 70°. The mixture is then heated at 100° for a further 3 hours and is then distilled. Boiling point=70°-72°/1 mm Hg. Yield=90%.

The NMR spectrum agrees with the structure indicated.

(b)

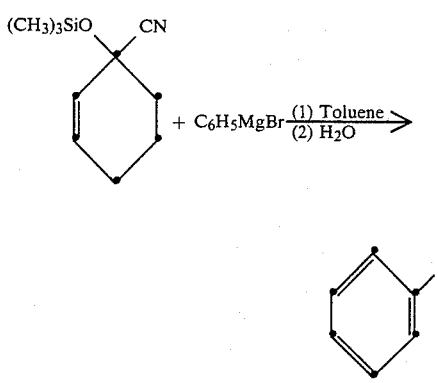

0.1 mol of phenylmagnesium bromide is prepared from equimolar quantities of bromobenzene and magnesium turnings in 60 ml of diethyl ether. When the reaction is complete, the mixture is diluted with 100 ml of dry toluene, and the ether is removed at 70° under reduced pressure. A solution of 0.09 mol of 1-cyano-1-trimethylsilyloxycyclohex-2-ene in 20 ml of toluene is then added dropwise at 5°. The mixture is allowed to react at room temperature for 4–5 hours, 100 ml of a 25% aqueous solution of acetic acid are then added dropwise, while cooling, and the mixture is stirred for a further brief period at room temperature. After adding 100 ml of diethyl ether, the organic phase is washed with water and then with sodium carbonate solution, dried over $Na_2SO_4$ and freed from the solvent.

The residue obtained is stirred overnight with 3N HCl in methanol in order to hydrolyse the silyl ether. The mixture is diluted with water and extracted three times with diethyl ether; the combined extracts are shaken with sodium bicarbonate solution, dried over $Na_2SO_4$ and evaporated on a rotary evaporator. The crude product which remains is a yellow oil.

The crude product is purified by chromatography over a silica gel column. Hexane containing 10% of ethyl acetate is used as the solvent. Pure 1-benzoyl-1-hydroxycyclohex-2-ene is obtained as a colourless oil in a yield of 40–50%. The NMR spectrum agrees with the structure indicated.

Elementary analysis ($C_{13}H_{14}O_2$): Calculated: C 77.20%; H 6.98%. Found: C 77.13%; H 7.02%.

EXAMPLE 4

The photopolymerisation of a lacquer resin

A resin mixture consisting of 50 parts of Actylan AJ 20 (an acrylate resin made by UCB, Belgium), 15 parts of trimethylolpropane trisacrylate, 15 parts of dicyclopentadienyloxyethyl acrylate, 10 parts of hexanediol diacrylate, 10 parts of N-vinylpyrrolidone and 2 parts of photoinitiator is applied in a thickness of 40 μm to glass sheets by means of a film applicator. These films are exposed to the atmosphere for approx. 20 seconds and are then irradiated with a medium-pressure Hg lamp (a model 45080 Hanovia instrument). The samples are then passed under the UV lamp on a conveyor belt at a speed of 20 m/minute.

The number of passes (P) required to obtain tackfree films are listed in the first column of the following table.

The second column gives the hardness of the films after varying numbers of passes, determined by a König pendulum apparatus (DIN 53,157).

The last column shows the yellowness index (YI) of the cured film as a criterion of yellowing.

| Photoinitiator | P | Pendulum hardness | YI |
|---|---|---|---|
| 1-Benzoyl-1-hydroxycyclohex-2-ene | 7 | 95" (7P) 110" (9P) | 6 |
| 1-Benzoyl-1-hydroxycyclohex-3-ene | 7 | 108" (7P) 114" (9P) | 7 |
| 1-Benzoyl-3,4-dimethyl-1-hydroxycyclohex-3-ene | 8 | 122" (8P) 124" (10P) | 6 |
| Mixture of approx. 75% of 1-benzoyl-1-hydroxy-4-methylcyclohex-3-ene and 25% of 1-benzoyl-1-hydroxy-3-methylcyclohex-3-ene | 9 | 116" (9P) 119" (11P) | 6 |
| endo-2-Benzoyl-2-hydroxybicyclo[2.2.2]oct-5-ene | 7 | 136" (7P) 149" (9P) | 6 |
| Mixture of approx. 70% of endo- and 30% of exo-2-benzoyl-2-hydroxybicyclo[2.2.2]oct-5-ene | 9 | 109" (9P) 137" (11P) | 7 |

What we claim is:

1. A process for the photopolymerisation of unsaturated compounds in the presence of a photoinitiator belonging to the series comprising the aroyl compounds, which comprises using, as the photoinitiator, one or more compounds formula I, II, III, IV or V

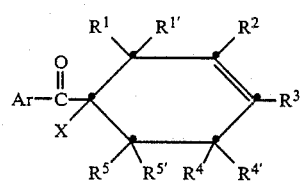

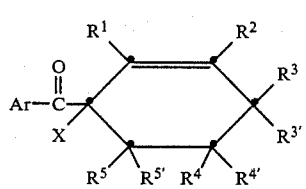

-continued

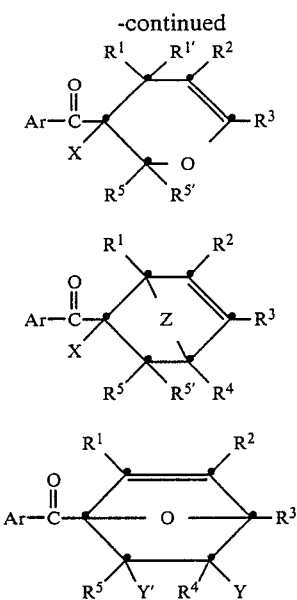

wherein Ar is $C_6$–$C_{12}$-aryl, thienyl, pyridyl or furyl which is unsubstituted or substituted by one or more of the radicals halogen, phenyl, $C_1$–$C_{12}$-alkyl, $C_5$–$C_8$-cycloalkyl, —OH, $C_1$–$C_4$-alkoxy, phenoxy, —SH, $C_1$–$C_4$-alkylthio, phenylthio, 2-hydroxyethylthio, $C_2$–$C_5$-alkanoylamino, benzoylamino, $C_2$–$C_{12}$-dialkylamino, pyrrolidino, piperidino, morpholino, 4-methylpiperazino or benzoyl, $R^1$, $R^{1'}$, $R^2$, $R^3$, $R^{3'}$, $R^4$, $R^{4'}$, $R^5$ and $R^{5'}$ independently of one another are H, $C_1$–$C_8$-alkyl, phenyl or $C_3$–$C_8$-alkenyl, X is a radical —N($R^6$)($R^7$), —O$R^8$ or —OSi($R^9$)$_2$($R^{10}$) in which $R^6$ and $R^7$ independently of one another are H, $C_1$–$C_{12}$-alkyl or $C_2$–$C_4$-alkyl, $C_3$–$C_5$-alkenyl, cycloalkyl, $C_7$–$C_9$-phenylalkyl or phenyl which is substituted by OH, $C_1$–$C_{12}$-alkoxy, $C_2$–$C_5$-carboalkoxy or CN, or $R^6$ and $R^7$ together are $C_3$–$C_5$-alkylene which can be interrupted by —O— or —N(CH$_3$)—, $R^8$ is hydrogen, $C_1$–$C_{12}$-alkyl, $C_3$–$C_{12}$-alkoxyalkyl, $C_3$–$C_5$-alkenyl, benzyl, phenyl or 2-tetrahydropyranyl and $R^9$ and $R^{10}$ are $C_1$–$C_4$-alkyl or phenyl, Y is hydrogen, —CN, —COOH, —COO$R^{11}$, —CO—$R^{12}$ or —CO-phenyl, $R^{11}$ being $C_1$–$C_{12}$-alkyl, $C_2$–$C_4$-hydroxyalkyl, $C_3$–$C_8$-alkoxyalkyl or cyclohexyl and $R^{12}$ being hydrogen or $C_1$–$C_4$-alkyl, Y' is hydrogen, —COOH or —COO$R^{11}$, or Y and Y' together are —CO—O—CO— and Z is a group of the formula —CH$_2$—, —CH$_2$CH$_2$—, —C(CH$_3$)$_2$—,

or —O—.

2. A process according to claim 1, wherein the photoinitiator used is one or more compounds of the formula I, II, III, IV or V in which Ar is $C_6$–$C_{10}$-aryl which is unsubstituted or substituted by chlorine, $C_1$–$C_4$-alkyl, $C_1$–$C_4$-alkoxy, $C_1$–$C_4$-alkylthio, 2-hydroxyethylthio, phenoxy, phenylthio or benzoyl, $R^1$, $R^2$, $R^3$, $R^4$ and $R^5$ independently of one another are H, phenyl or methyl and $R^{1'}$, $R^{3'}$, $R^{4'}$ and $R^{5'}$ are hydrogen, X is a radical —N($R^6$)($R^7$), —O$R^8$ or —OSi($R^9$)$_3$ in which $R^6$ and $R^7$ independently of one another are H, $C_1$–$C_4$-alkyl or $C_3$–$C_5$-alkenyl, or the two radicals together are $C_3$–$C_5$-alkylene which can be interrupted by —O— or —N(CH$_3$)—, $R^8$ is hydrogen, $C_1$–$C_{12}$-alkyl, $C_3$–$C_5$-alkenyl, benzyl or 2-tetrahydropyranyl and $R^9$ is methyl or phenyl, Y is a radical —CN or —COO$R^{11}$ and Y' is hydrogen or —COO$R^{11}$, $R^{11}$ being $C_1$–$C_4$-alkyl, and Z is a group of the formula —CH$_2$—, —CH$_2$CH$_2$—, —C(CH$_3$)$_2$— or —O—.

3. A process according to claim 1, wherein the photoinitiator used is one or more compounds of the formula I, II or IV in which Ar is phenyl or phenyl which is substituted by Cl, CH$_3$, —OCH$_3$, —SCH$_3$, phenoxy or benzoyl, $R^1$, $R^2$, $R^3$, $R^4$ and $R^5$ independently of one another are hydrogen or methyl and $R^{1'}$, $R^{3'}$, $R^{4'}$ and $R^{5'}$ are hydrogen, X is a radical —N($R^6$)($R^7$), —O$R^8$ or —OSi($R^9$)$_3$ in which $R^6$ and $R^7$ are $C_1$–$C_4$-alkyl, or $R^6$ and $R^7$ together are $C_3$–$C_5$-alkylene which can be interrupted by —O— or —N(CH$_3$)—, $R^8$ is hydrogen, methyl, allyl or benzyl and $R^9$ is methyl and Z is a group of the formula —CH$_2$—, —CH$_2$CH$_2$— or —O—.

4. A process according to claim 3, wherein the photoinitiator used is one or more compounds of the formula I or IV in which X is hydroxyl and the remaining substituents have the meaning given in claim 3.

5. A process according to claim 1, wherein the photopolymerisation is effected by irradiation with UV light.

6. A photopolymerisable mixture containing one or more monomeric or oligomeric, ethylenically unsaturated compounds and a photoinitiator according to claim 1.

7. A photopolymerisable mixture according to claim 6, containing a pigment, as a printing ink.

8. A printing ink according to claim 7, containing, as photoinitiators, a compound of the formula I, II, III or IV in which X is a radical —N($R^6$)($R^7$), Ar is phenyl which is substituted by —OH, $C_1$–$C_4$-alkoxy, phenoxy, —SH, $C_1$–$C_4$-alkylthio or 2-hydroxyethylthio and $R^6$ and $R^7$ are as defined in claim 1.

9. A photopolymerisable mixture according to claim 6, containing 0.1 to 20% by weight, in particular 0.5 to 5% by weight, of photoinitiator, relative to the photopolymerisable compounds.

* * * * *